United States Patent [19]

Shinji

[11] Patent Number: 5,240,873
[45] Date of Patent: Aug. 31, 1993

[54] METHOD OF MAKING CHARGE TRANSFER DEVICE

[76] Inventor: Uya Shinji, Jookong Apt. 266-510, Wonmun-dong, Kwacheion-si, Kunghki-do, Rep. of Korea

[21] Appl. No.: 944,879

[22] Filed: Sep. 14, 1992

[30] Foreign Application Priority Data

Sep. 14, 1991 [KR] Rep. of Korea ............... 16045/1991

[51] Int. Cl.⁵ .......................................... H01C 21/72
[52] U.S. Cl. ......................................... 437/53; 437/50
[58] Field of Search ................... 437/50, 53, 228; 148/DIG. 50

[56] References Cited

U.S. PATENT DOCUMENTS 4,083,098 4/1978 Nicholas .

FOREIGN PATENT DOCUMENTS 52-20771  2/1977  Japan .
53-110385 9/1978  Japan .
63-116466 5/1988  Japan .
63-244882 10/1988 Japan .

*Primary Examiner*—George Fourson
*Attorney, Agent, or Firm*—Poms, Smith, Lande & Rose

[57] ABSTRACT

A method of making a charge transfer device, capable of forming a plurality of transfer electrodes, using a single conductive layer, with a narrow transfer electrode gap enough to achieve a high transfer efficiency. The method comprises forming an impurity layer of a second conductivity type, a first insulating layer and a semiconductor layer in this order, over a first conductivity type semiconductor substrate, forming spaced semiconductor layer patterns, forming a second insulating layer over the resultant entire exposed surface and implanting impurity ions of the first conductivity type in the second conductivity type impurity layer so as to form spaced impurity layers of the first conductivity type, and forming a third insulating layer over the resultant entire exposed surface and etching back the third insulating layer to the semiconductor layer patterns. After removing the semiconductor layer patterns and the remaining third insulating layer, a conductive layer and a fourth insulating layer are formed over the entire surface of the remaining second insulating layer. Thereafter, the fourth insulating layer, the conductive layer and the second insulating layer are etched back, so as to form separate conductive layer patterns as transfer electrodes.

25 Claims, 11 Drawing Sheets

(d)

(e)

(f)

(a)

(b)

(c)

(d)

METHOD OF MAKING CHARGE TRANSFER DEVICE

BACKGROUND OF THE INVENTION

1. Field of the Invention

The present invention relates to charge transfer devices used in solid state image elements or signal delay devices, and more particularly to a method of making a charge transfer device having a plurality of transfer electrodes made of a single conductive layer.

2. Description of the Prior Art

Generally, charge transfer devices and signal delay devices use charge transfer devices which transfer sequentially charges of video signals in one direction by utilizing a potential difference. Such devices for transferring charges of video signals comprise a plurality of uniformly spaced transfer electrodes arranged on a silicon substrate by means of an insulating layer. By a drive voltage applied to each transfer electrode, a charge accumulated in a channel defined at the upper portion of silicon substrate flows in one direction toward an adjacent transfer electrode.

Now, conventional methods of making charge transfer devices will be described in conjunction with FIGS. 2a to 3d.

The method illustrated in FIGS. 2a to 2f uses a polycrystalline silicon material as a charge electrode material and a thermal oxidation process for providing an electrical isolation between adjacent transfer electrodes, capable of making the gap between adjacent transfer electrodes sufficiently small.

In accordance with the method, on a P type silicon substrate 1 are formed a N type impurity diffusion layer 2, a silicon oxide film 3 and a first polycrystalline silicon layer 4 doped with an impurity, in this order, as shown in FIG. 2a. The first polycrystalline silicon layer 4 is then selectively etched using a reactive ion etching (RIE) method under the condition that a photoresist (not shown) is used as a mask, so as to form a first polycrystalline silicon pattern 4a as a first transfer electrode, as shown in FIG. 2b.

Thereafter, the exposed portion of silicon oxide film 3 which was subjected to an etching damage upon performing the RIE method is etched under the condition of using the first polycrystalline silicon pattern 4a as a mask, as shown in FIG. 2c. As a result, the silicon oxide film 3 remains only at its portion disposed beneath the first polycrystalline silicon pattern 4a.

Another silicon oxide film 5 is formed over the resultant entire exposed surface, that is, the exposed portions of the N type impurity diffusion layer 2 and the first polycrystalline silicon pattern 4a, by using the thermal oxidation method, as shown in FIG. 2d. Over the silicon oxide film 5 is then formed a second polycrystalline silicon layer 6 doped with an impurity.

As shown in FIG. 2e, the second polycrystalline silicon layer 6 is selectively etched for forming a second polycrystalline silicon pattern 6a as a second transfer electrode.

Subsequently, the exposed surface of the second polycrystalline silicon pattern 6a is thermally oxidized, thereby causing a silicon oxide film 7 to be formed, as shown in FIG. 2f. Over the silicon oxide film 7 is formed a smoothing boron phosphorous silicate glass (BPSG) layer 8.

In accordance with the above-mentioned method, it is possible to achieve a small gap of not more than 0.2 $\mu$m between adjacent transfer electrodes. This is because the gap defined between the first and second transfer electrodes depends on the thickness of the silicon oxide film 5 formed by the oxidation of the first polycrystalline silicon pattern 4a as the first transfer electrode. Accordingly, it is possible to achieve a state of hardly generating a potential pocket caused by the gap between the first and second transfer electrodes.

This method utilizing a double-layered polycrystalline silicon layer is suitable for achieving a sufficiently small transfer electrode gap, in that a high transfer efficiency is achieved. In this regard, most of currently commercial signal transfer devices utilize the method.

In devices handling minute signal charges such as solid state image elements, use of the above-mentioned method may cause certain problems.

For example, it is needed to provide two conductive layers for forming transfer electrodes, resulting in a complexity in manufacture. Moreover, the exposure of the thermally oxidized surface of silicon substrate increases a danger that the surface is contaminated by impurities. By such a contamination, a local abnormality in potential occurs beneath transfer electrodes, thereby causing video signal charges to be coupled. Such a coupling prevents an accurate transfer of signal charges.

It is also needed to provide a certain overlap space for assuring an overlap between the first and second transfer electrodes made of different conductive materials. Due to such an overlap space, there is a limitation on reducing the area occupied by transfer electrodes.

In addition, the overlap between the first and second transfer electrodes increases the layer capacitance between the first and second transfer electrodes to which different clock pulses are applied, resulting in unnecessarily increasing the consumption of electric power for driving signal charge transfer devices.

The use of polycrystalline silicon for the first and second transfer electrodes causes a degradation in performance in the signal charge transfer devices. In charge coupled devices of a frame transfer type having a structure in which incident lights corresponding video signals pass through transfer electrodes made of polycrystalline silicon, the sensitivity to blue color is decreased due to the characteristic of polycrystalline silicon absorbing lights of a short wave-length, thereby causing the spectral sensitivity charactersitic to be distorted.

Since the polycrystalline silicon has too high resistance to be used for transfer electrodes, it is unsuitable for signal charge transfer devices for a high speed driving. Accordingly, these devices should have a transfer electrode construction made of a material having a transmittivity higher than that of polycrystalline silicon and a electrode material having a lower resistance.

On the other hand, FIGS. 3a to 3d illustrate a method for forming transfer electrodes by using a single polycrystalline silicon layer.

In accordance with the method, on a P type silicon substrate 11 are first formed a N type impurity diffusion layer 12, a silicon oxide film 13 and a first polycrystalline silicon layer 14 doped with an impurity, in this order, as shown in FIG. 3a. Over the first polycrystalline silicon layer 14, a photoresist pattern 15 is then formed which corresponding to each transfer electrode to be formed, as shown in FIG. 3b. Using the photoresist pattern 15 as a mask, the first polycrystalline silicon layer 14 is then selectively etched using an anisotropy etching method such as the RIE method, so as to form a first polycrystalline silicon pattern 14a a first transfer electrode, as shown in FIG. 3b.

Thereafter, the photoresist pattern 15 is removed, so as to expose the surface of the first polycrystalline silicon pattern 14a which is, in turns, subjected to a thermal oxidation, thereby forming a silicon oxide film 16, as shown in FIG. 3c. Over the silicon oxide film 16 is formed as BPSG layer 17 for providing a surface smoothness, as shown in FIG. 3d.

This method has the following advantages:

First, the manufacture is easy;

Second, the manufacture cost is inexpensive;

Third, there is no contamination by impurities because of no exposure of the silicon substrate and no occurrence of a damage caused by the thermal oxidation;

Fourth, the capacitance between transfer electrodes is reduced; and

Finally, there is no limitation on the material of transfer electrodes.

On the other hand, the method has the following disadvantage:

That is, it is difficult to a sufficient narrow transfer electrode gap to obtain a high charge transfer efficiency, taking into consideration the current semiconductor processing techniques on which the size of gap depends.

In charge transfer devices for a high drive speed in which drive pulses have a frequency of a MHZ band, a two-phase drive type charge coupled device (CCD) is generally adapted to obtain a higher charge transfer efficiency. In making such a two-phase drive type CCD, a self-aligning method is important.

Now, a conventional method of making a two-phase drive type charge transfer device using a self-alignment will be described.

In accordance with the method, on a P type silicon substrate 21 are formed a N type impurity diffusion layer 22, a silicon oxide film 23 and a first polycrystalline silicon layer 24 doped with an impurity, in this order, as shown in FIG. 4a. The first polycrystalline silicon layer 24 is then selectively etched using the RIE method under the condition that a photoresist 25 is used as a mask, so as to form a first polycrystalline silicon pattern 24a as a first transfer electrode, as shown in FIG. 4b.

After removing the photoresist pattern 25, the exposed portion of silicon oxide film 23 which was subjected to an etching damage upon performing the RIE method is etched under the condition of using the first polycrystalline silicon pattern 24a as a mask, as shown in FIG. 4c. As a result, the silicon oxide film 23 remains only at its portion disposed beneath the first polycrystalline silicon pattern 24a.

Thereafter, the resultant entire exposed surface is subjected to a thermal oxidation for forming another silicon oxide film 26 over the surface of N type impurity diffusion layer 22 and the surface of first polycrystalline silicon pattern 24a, as shown in FIG. 4d. Under the condition of using the first polycrystalline silicon pattern 24a as a mask, a P type impurity is implanted in the N type impurity diffusion layer 22, so as to form a P type impurity layer 27. Accordingly, the formation of P type impurity layer 27 is achieve in a self-aligned manner, without using any additional mask.

Over the resultant entire exposed surface is then formed a second polycrystalline silicon layer 28 doped with an impurity, as shown in FIG. 4e. As shown in FIG. 4f, the second polycrystalline silicon layer 28 is selectively etched for forming a second polycrystalline silicon pattern 28a as a second transfer electrode. Subsequently, the exposed surface of the second polycrystalline silicon pattern 28a is thermally oxidized, thereby causing a silicon oxide film 29 to be formed. Over the resultant entire exposed surface is formed a BPSG layer 30 as a smoothing layer.

FIG. 4g illustrates a wired condition of the obtained signal charge transfer device wherein adjacent first and second polycrystalline silicon patterns 2a and 28a are connected with each other by means of wires, so as to apply two-phase drive clock signals $_1$ and $_2$ to each other alternately.

The self-aligning process used in the case of FIGS. 4a to 4g is not used in the case of FIGS. 3a to 3d. As a result, where a P type impurity region or layer is formed at the N type impurity diffusion layer 12 so as to provide a potential well in the latter case, an arrangement shown in FIGS. 5a to 5c may be formed. In FIGS. 5a and 5c, the P type impurity layer is designated by the reference numeral 18.

In case shown in FIG. 5a, when two-phase drive clock signals $_1$ and $_2$ are applied, a potential barrier B occurs unnecessarily due to the space between the first polycrystalline silicon pattern and the P type impurity layer 18, as shown in FIG. 5b. In case shown in FIG. 5c, a potential pocket P occurs unnecessarily when two-phase drive clock signals $_1$ and $_2$ are applied, as shown in FIG. 5d. as a result, the signal charge transfer efficiency is considerably reduced.

As apparent from the above description, the conventional method using a double-layered polycrystalline silicon structure for transfer electrodes involves many difficulties in manufacture and limitations on designs of charge transfer devices, while achieving a narrow transfer electrode gap.

On the other hand, the conventional method using a single polycrystalline silicon layer for transfer electrodes achieves hardly a narrow transfer electrode gap due to the limitations of photoing and etching techniques. Moreover, the method for forming single-layered transfer electrodes has a disadvantage that the self-aligning process for making a two-phase drive type CCD can not be used.

SUMMARY OF THE INVENTION

Therefore, the present invention has been made in view of the above-described prior art problem and an object of the invention is to provide a method of making a charge transfer device, capable of forming a plurality of transfer electrodes by a single conductive layer, achieving a sufficiently narrow transfer electrode gap, and using a self-aligning process for making a two-phase clock drive type charge coupled device.

In accordance with the present invention, a semiconductor substrate of a first conductivity type is first prepared. Over the first conductivity type semiconductor substrate are formed an impurity layer of a second conductivity type, a first insulating layer and a semiconductor layer in this order. The semiconductor layer is patterned by a photoing and etching process, so as to form uniformly spaced semiconductor layer patterns. A second insulating layer is formed over the resultant entire exposed surface after the formation of the semiconductor layer patterns. Impurity ions of the first conductivity type are then implanted in the second conductivity type impurity layer so as to form uniformly spaced impurity layers of the first conductivity type. Over the resultant entire exposed surface, a third insulating layer for providing a surface smoothness is formed which is then etched back to the upper surfaces of the semiconductor layer patterns. After removing the semiconductor layer patterns and the remaining portions of the third insulating layer, a conductive layer and a fourth insulating layer for providing a surface smoothness are formed over the entire surface of the remaining second insulating layer. Thereafter, the fourth insulating layer, the conductive layer and the second insulating layer are etched back uniformly, so as to form a plurality of separate conductive layer patterns as transfer electrodes. The remaining portions of the fourth insulating layer disposed over respective conductive layer patterns are then removed. Over the resultant entire exposed surface, a fifth insulating layer is formed.

Alternatively, the formation of separate conductive layer patterns is achieved by etching back the fourth insulating layer to its predetermined depth portion until each upper portion of the conductive layer is partially exposed and then removing partially each exposed upper portion of the conductive layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1a to 1g, there is illustrated a method of making a charge transfer device in accordance with the present invention.

Figure 3A:
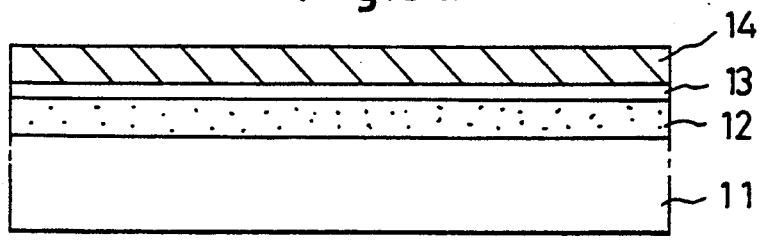
FIGS. 3a to 3d are sectional views illustrating another conventional method of making a charge transfer device.
Figure 3B:
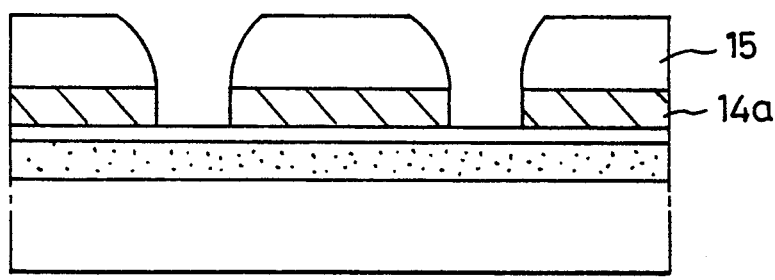
Figure 3C:
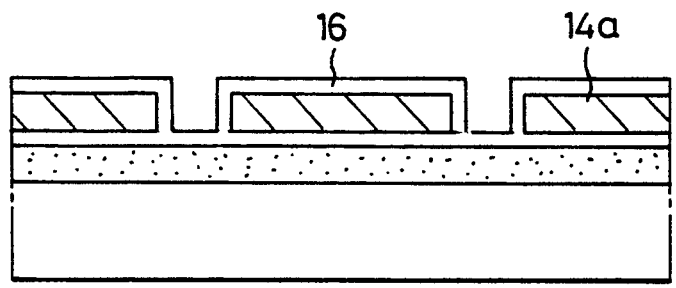
Figure 3D:
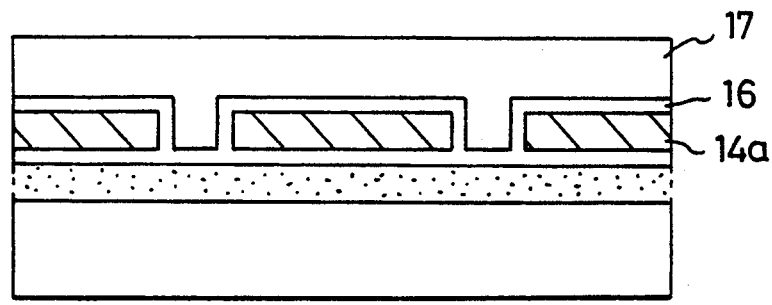
Figure 4A:
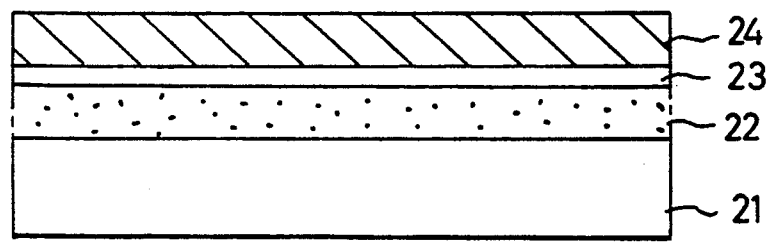
FIGS. 4a to 4g are sectional views illustrating another conventional method of making a charge transfer device.
Figure 4B:
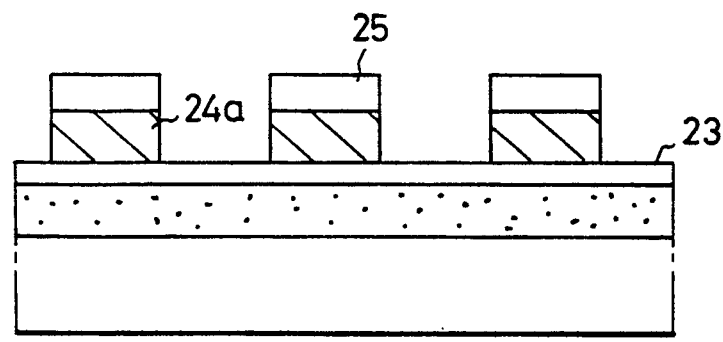
Figure 4C:
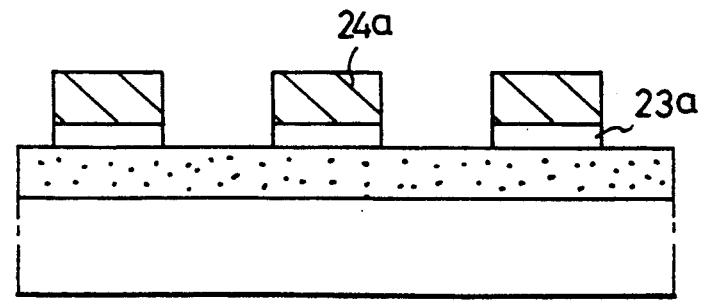
Figure 4D:
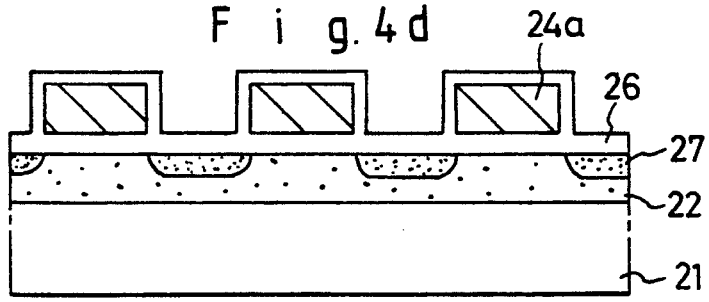
Figure 4E:
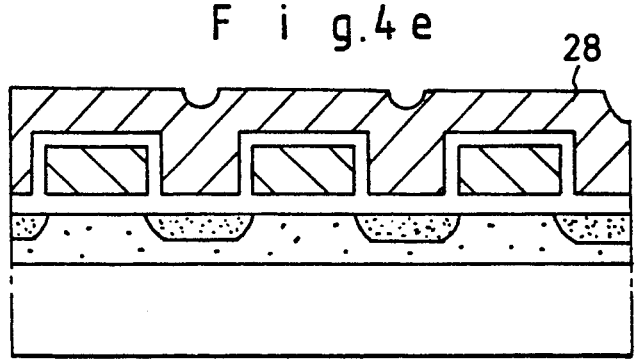
Figure 4F:
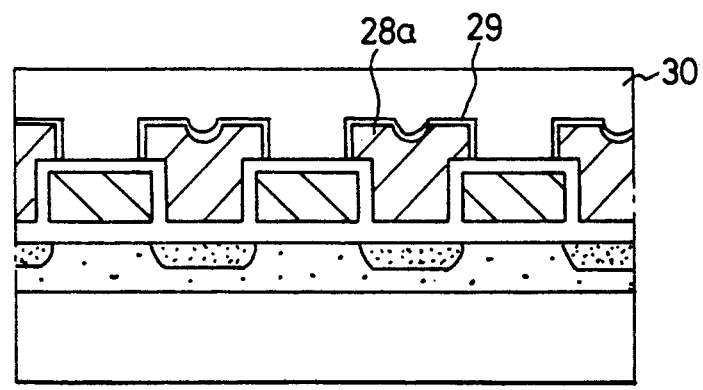
Figure 4G:
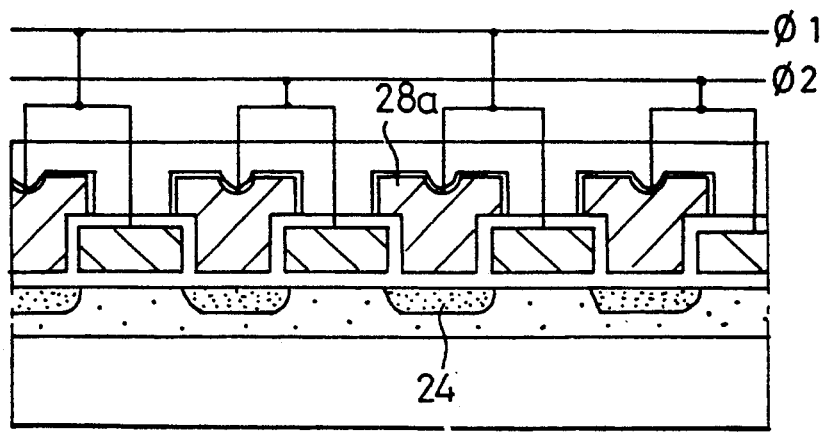
Figure 5A:
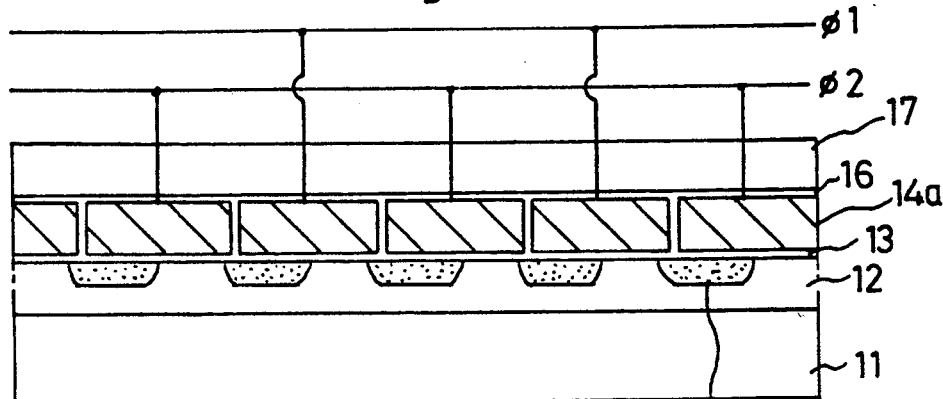
FIGS. 5a and 5b are schematic views for explaining an occurrence of a potential barrier in the prior arts.
Figure 5B:
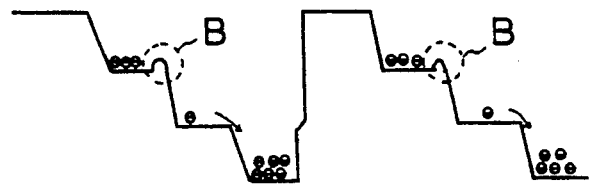
Figure 5C:
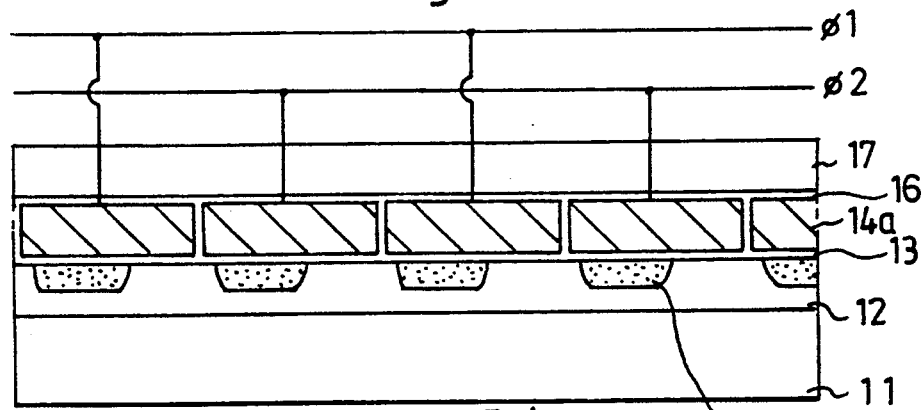
FIGS. 5c and 5d are schematic views for explaining an occurrence of a potential pocket in the prior arts.
Figure 5D:
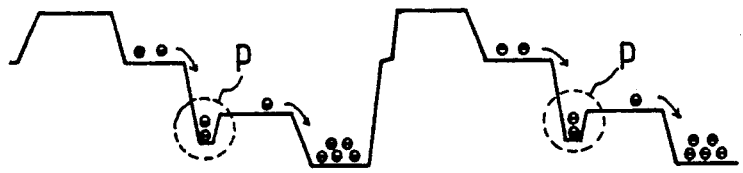

In accordance with the method, on a P type silicon substrate 31 are first formed a N type impurity diffusion layer 32, a silicon oxide film 33 and a polycrystalline silicon layer 34 doped with an impurity, in this order, as shown in FIG. 3a. Over the polycrystalline silicon layer 34, photoresist patterns 35 having a predetermined width are then formed.

Figure 1A:
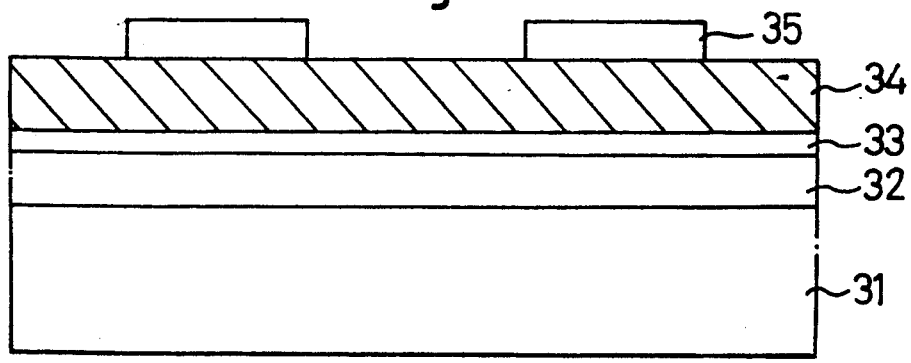
FIGS. 1a to 1g are sectional views illustrating a method of making a charge transfer device in accordance with the present invention.
Figure 1B:
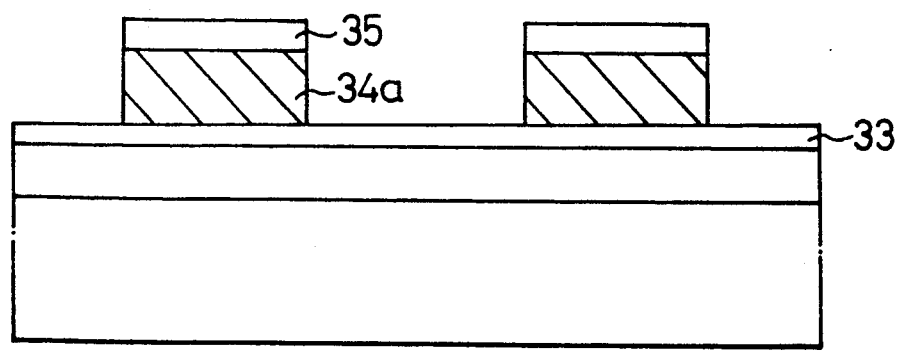

Using the photoresist patterns 35 as a mask, the polycrystalline silicon layer 34 is then subjected to a dry etching to remove its selected portions and thus form polycrystalline silicon patterns 34a having a predetermined width, as shown in FIG. 1b.

In this case, the N type impurity diffusion layer 32 can be formed by directly depositing a polycrystalline silicon doped with an N type impurity over the P type silicon substrate 31 using the CVD method or by implanting N type impurity ions in the surface of P type silicon substrate 31 and then diffusing the N type impurity ions to a predetermined depth in the P type silicon substrate 31.

On the other hand, the impurity doped polycrystalline silicon layer 34 can be formed by an in-situ process for implanting impurity ions of a predetermined conductivity, simultaneously with the deposition of polycrystalline silicon or by first depositing a polycrystalline silicon layer by the CVD method and then implanting impurity ions of a predetermined conductivity in the polycrystalline silicon layer.

Figure 1C:
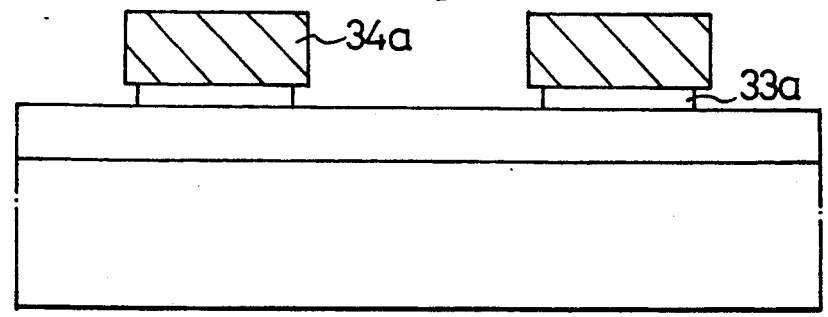

After removing the photoresist patterns 35, the exposed portion of silicon oxide film 33 which was subjected to an etching damage is dry etched under the condition of using the polycrystalline silicon pattern 34a as a mask, as shown in FIG. 1c. As a result, the silicon oxide film 33 remains only at its portions disposed beneath the polycrystalline silicon patterns 34a.

Figure 1D:
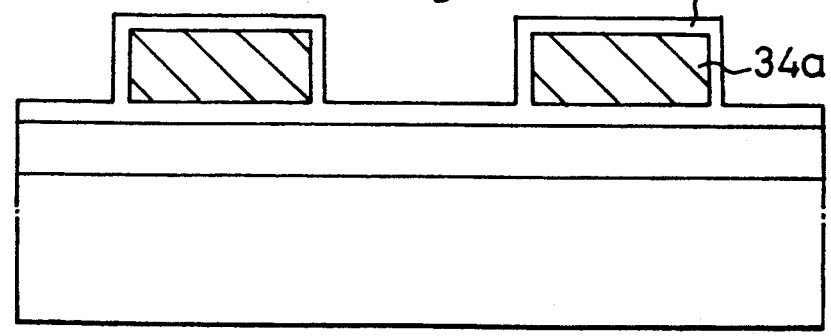
Figure 1E:
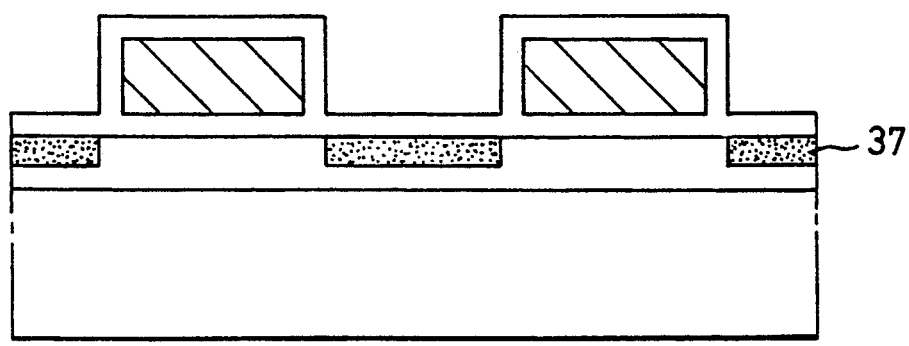

Thereafter, the resultant entire exposed surface is subjected to a thermal oxidation for forming another silicon oxide film 36 over the surface of N type impurity diffusion layer 32 and the surfaces of polycrystalline silicon patterns 34a, as shown in FIG. 1d. Under the condition of using the polycrystalline silicon patterns 34a as a mask, P type impurity ion are implanted in the N type impurity diffusion layer 32, so as to form P type impurity layers 37 spaced uniformly, as shown in FIG. 1e.

Figure 1F:
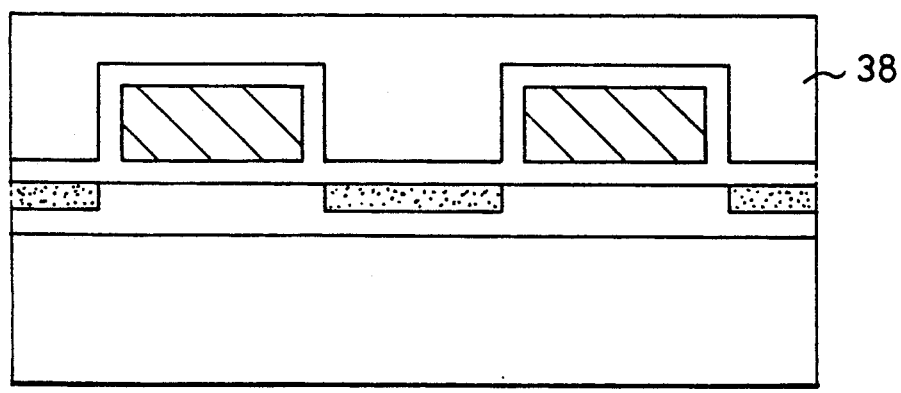

Over the resultant entire exposed surface is coated a first smoothing layer 38 which comprises, for example, a photoresist, BPSG and an organic material such as spin-on glass (SOG), as shown in FIG. 1f.

Figure 1G:
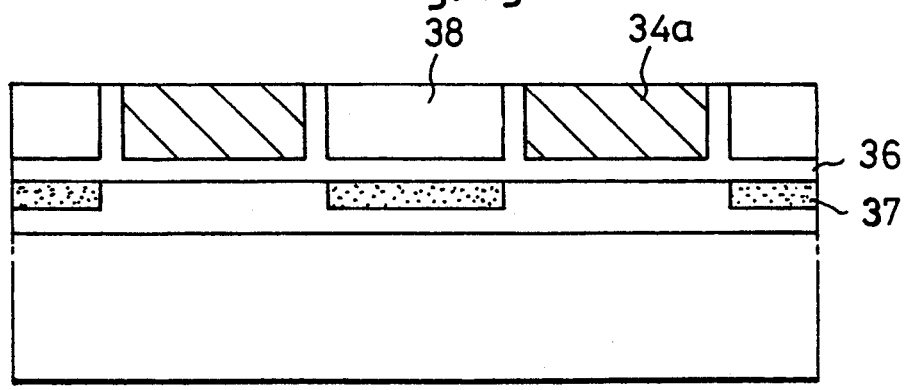

Thereafter, the first smoothing layer 38 is uniformly etched to expose the upper surfaces of polycrystalline silicon patterns 34a, under the condition of functioning the upper surfaces as an etch ending point, as shown in FIG. 1g. Accordingly, the first smoothing layer 38 remains at its portions disposed between adjacent polycrystalline silicon patterns 34a.

Figure 1H:
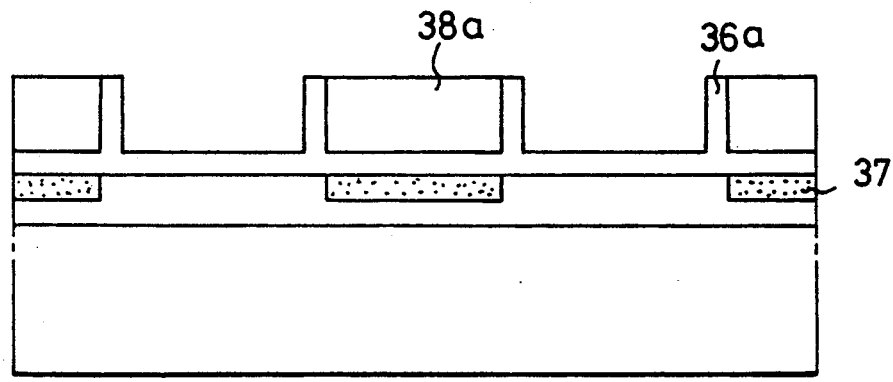
Figure 1I:
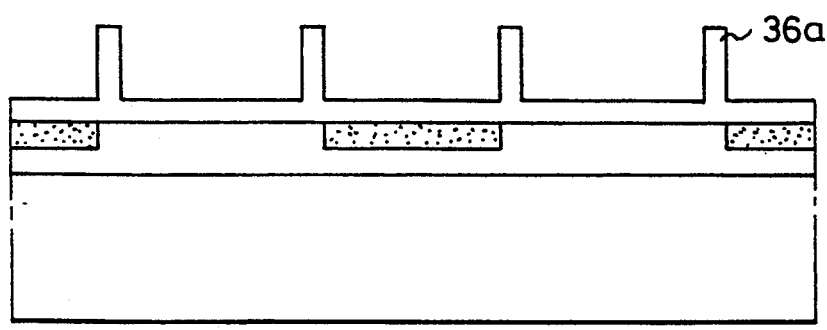

As shown in FIG. 1h, the polycrystalline silicon patterns 34a are selectively etched using a chemical dry etching method or a wet etching method, so as to be removed completely. As a result, the silicon oxide film 36 has been removed at its portions disposed over the upper surfaces of polycrystalline silicon patterns 34a.

Figure 1J:
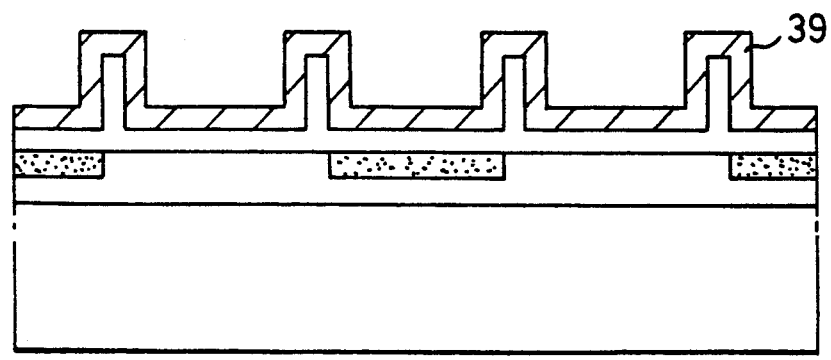

Subsequently, the remaining portions of first smoothing layer 38 are removed using the dry etching method or the wet etching method. Over the resultant entire exposed surface, a conductive layer 39 is then formed as shown in FIG. 1j.

Figure 1K:
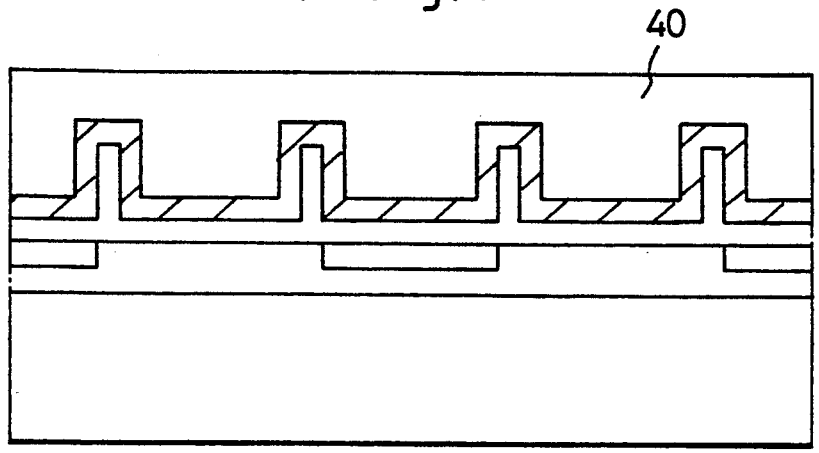

Over the conductive layer 39 is coated a second smoothing layer 40 which comprises a photoresist, a BPSG and an organic material such as SOG, as shown in FIG. 1k.

Figure 1L:
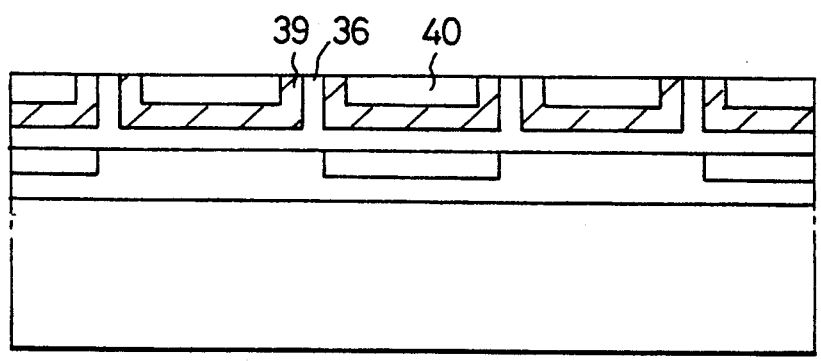

For dividing the conductive layer 39 into a plurality of its portions, the second smoothing layer 40, the conductive layer 39 and the remaining portions of silicon oxide film 36 are etched at the same etch rate to a predetermined depth in the second smoothing layer 40, as shown in FIG. 1l. Accordingly, the conductive layer 39 is divided into a plurality of conductive layer patterns 39a each corresponding to each transfer electrode.

Figure 1M:
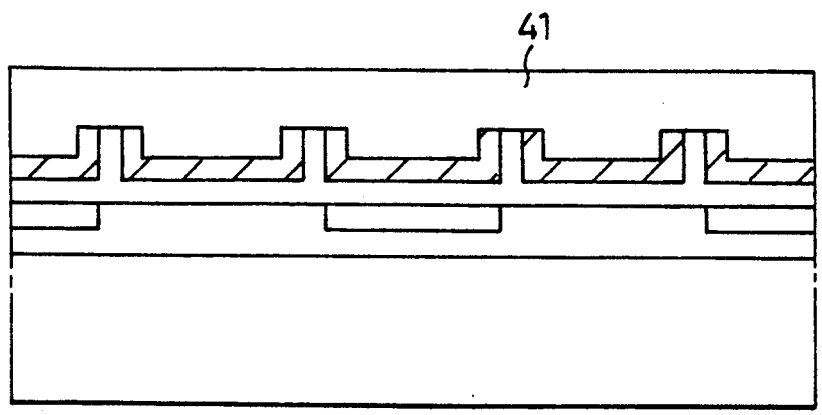

Over the resultant entire exposed surface is then formed a passive layer 41 which comprises a BPSG, a photoresist and an insulating material such as SOG, as shown in FIG. 1m.

The processes of FIGS. 1*l* and 1*m* for forming the conductive patterns 39*a* can be substituted by the processes of FIGS. 1*n* to 1*q* which will be described hereinafter.

Figure 1N:
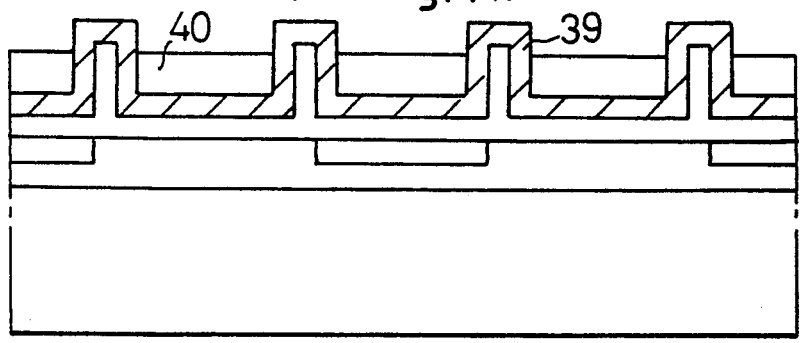
Figure 1O:
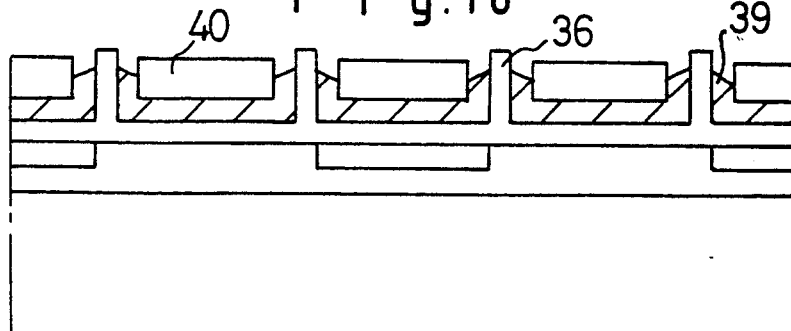

In accordance with the processes of FIGS. 1*n* to 1*q*, only the second smoothing layer 40 is first etched to a predetermined depth so as to expose partially the upper portions of conductive layer 39, as shown in FIG. 1*n*. Thereafter, the exposed portions of conductive layer 39 are selectively wet etched, as shown in FIG. 1*o*. As a result, the conductive layer 39 is divided into a plurality of conductive layer patterns 39*a* each corresponding to each transfer electrode.

Figure 1P:
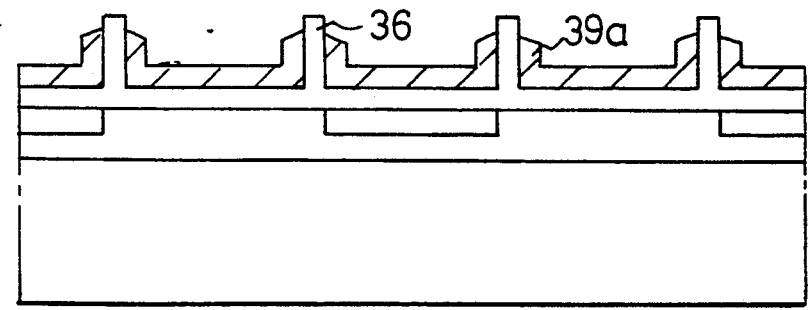

After the formation of conductive layer patterns 39*a*, the remaining portions of second smoothing layer 40 are removed, as shown in FIG. 1*p*.

Figure 1Q:
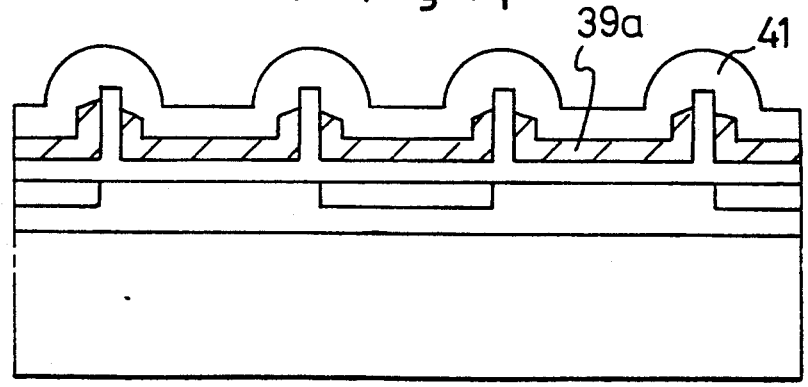
Figure 2A:
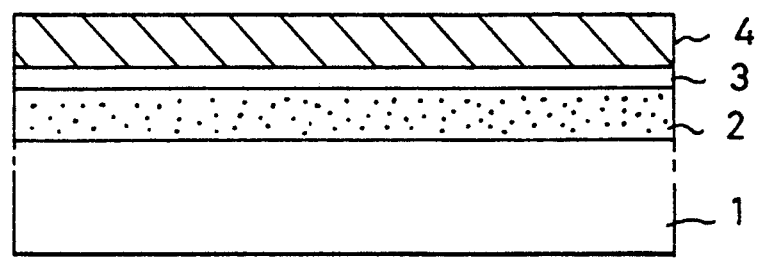
FIGS. 2a to 2f are sectional views illustrating a conentional method of making a charge transfer device.
Figure 2B:
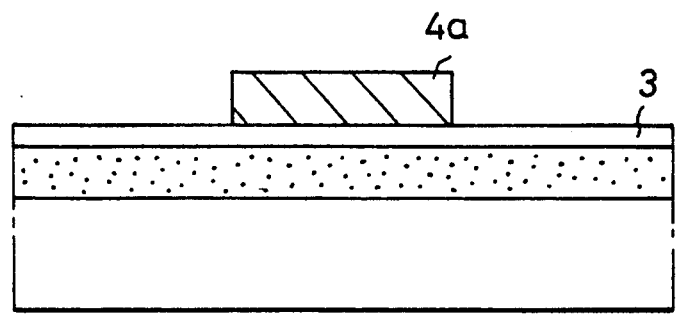
Figure 2C:
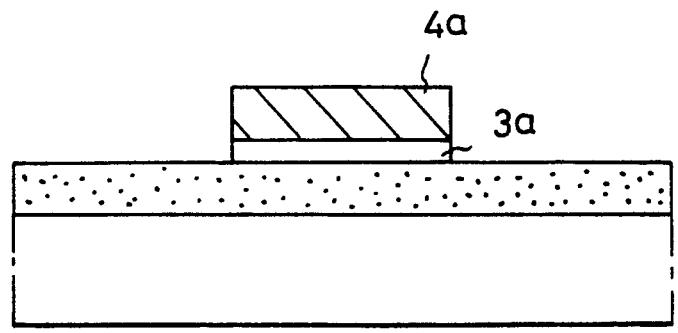
Figure 2D:
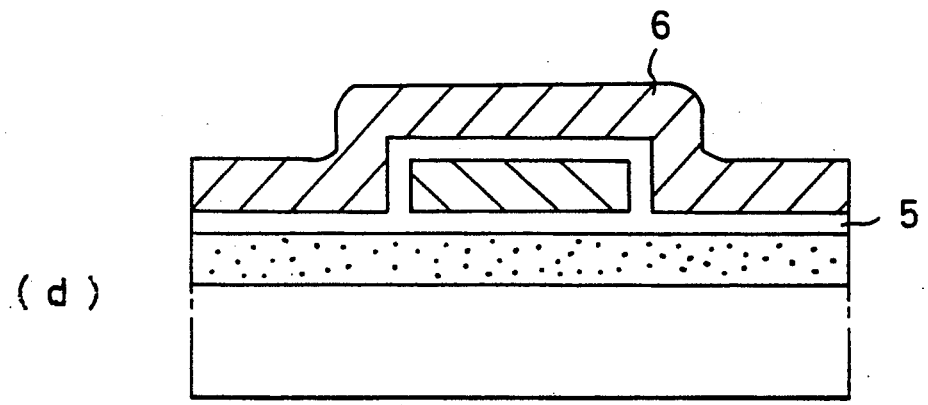
Figure 2E:
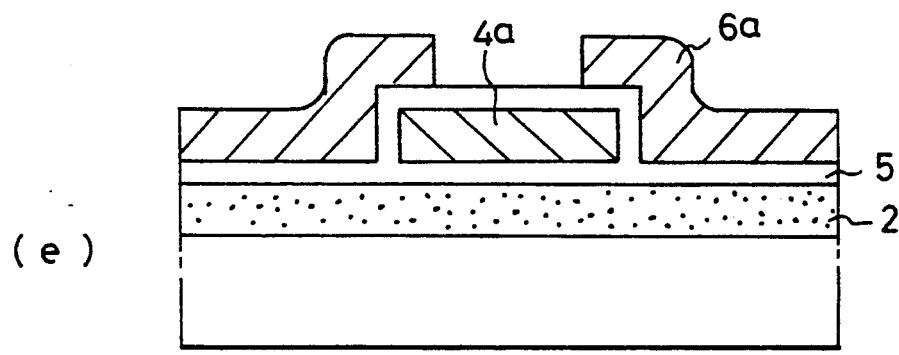
Figure 2F:
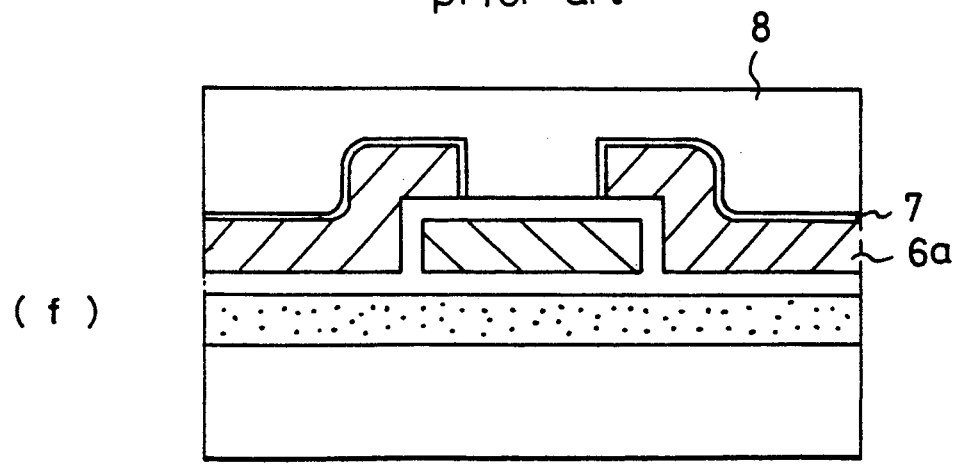

Over the resultant entire exposed surface is then formed a passive layer 41 which comprises a BPSG, a photoresist and an insulating material such as SOG, as shown in FIG. 1*q*.

Although the preferred embodiment of the invention has been disclosed for illustrative purpose, the invention is not limited thereto. For example, the process for etching the polycrystalline silicon layer 34 is not limited to the RIE method, but can be other anisotropy etch methods. In place of such anisotropy etch methods, an isotropy method can be also used. In case of using such an isotropy etch method, a side etching with a sufficiently large width is carried out so that the side walls of each polycrystalline silicon pattern 34*a* extend approximately in perpendicular to the P type silicon substrate 31.

The material of conductive layer 39 may include a metal such as aluminum or tungsten, a transparent electrode material such as indium tin oxide, or a polycrystalline silicon. The formation of conductive layer 39 is also not limited to the above-mentioned embodiment, but can be variously modified.

Furthermore, although the above-mentioned embodiment comprises the process for removing the exposed portions of silicon oxide film 33 after the etching of polycrystalline silicon layer 34, such a removal is not required if the silicon oxide film 33 is not subjected to a damage upon etching the polycrystalline silicon layer 34. In the latter case, the same effect can be obtained.

Those skilled in the art will appreciate that various modifications, additions and substitutions are possible, without departing from the scope and spirit of the invention as disclosed in the accompanying claims.

As apparent from the above description, the method of the present invention makes it possible to form a plurality of transfer electrodes, using a single conductive layer, with a narrow transfer electrode gap enough to achieve a high transfer efficiency.

In making a two-phase drive type charge transfer device, a P type impurity layer can be formed in a self-aligned manner by using polycrystalline silicon patterns as a mask, in accordance with the present invention, undesired potential pocket and barrier are not formed upon applying two-phase drive clock signals. Accordingly, a reduction in signal charge transfer efficiency can be prevented.

There is no limitation on the material of single conductive layer for forming the transfer electrodes. As a result, the transfer electrode material can comprises a metal such as aluminum or a transparent electrode material such as indium tin oxide, which materials could not be used in the conventional methods.

What is claimed is:

1. A method of making a charge transfer device comprising the steps of:
   preparing a semiconductor substrate of a first conductivity type;
   forming an impurity layer of a second conductivity type, a first insulating layer and a semiconductor layer in this order, over the first conductivity type semiconductor substrate;
   patterning the semiconductor layer so as to form uniformly spaced semiconductor layer patterns;
   forming a second insulating layer over the resultant entire exposed surface after the formation of the semiconductor layer patterns and implanting impurity ions of the first conductivity type in the second conductivity type impurity layer so as to form uniformly spaced impurity layers of the first conductivity type;
   forming a third insulating layer for providing a surface smoothness over the resultant entire exposed surface after the formation of the first conductivity type impurity layers and etching back the third insulating layer to the upper surfaces of the semiconductor layer patterns;
   removing the semiconductor layer patterns and the remaining portions of the third insulating layer;
   forming a conductive layer and a fourth insulating layer for providing a surface smoothness in this order, over the entire surface of the remaining second insulating layer;
   etching back the resultant upper portion after the formation of the fourth insulating layer uniformly, so as to form a plurality of separate conductive layer patterns as transfer electrodes;
   removing the remaining portions of the fourth insulating layer disposed over respective conductive layer patterns; and
   forming a fifth insulating layer over the resultant entire exposed surface after the removal of the fourth insulating layer.

2. A method of making a charge transfer device, in accordance with claim 1, wherein the step of forming the second conductivity type impurity layer comprises the steps of:
   implanting impurity ions of the second conductivity type in the surface of the first conductivity type semiconductor substrate; and
   diffusing the second conductivity type impurity ions to a predetermined depth in the first conductivity type semiconductor substrate.

3. A method of making a charge transfer device, in accordance with claim 1, wherein the step of forming the second conductivity type impurity layer comprises the steps of forming another semiconductor layer over the first conductivity type semiconductor substrate; and
   implanting impurity ions of the second conductivity type in the surface of the another semiconductor layer, simultaneously with the formation of the another semiconductor layer.

4. A method of making a charge transfer device, in accordance with claim 1, wherein the semiconductor layer comprises polycrystalline silicon.

5. A method of making a charge transfer device, in accordance with claim 1, further comprising the step of dry etching the exposed portions of the first insulating layer using the semiconductor layer patterns as a mask prior to the formation of the second insulating layer, so as to remove the exposed portions of the first insulating layer.

6. A method of making a charge transfer device, in accordance with claim 1, wherein the formations of the first and second insulating layers are achieved by thermally oxidizing the first conductivity type semiconductor substrate and each semiconductor layer pattern, respectively.

7. A method of making a charge transfer device, in accordance with claim 1, wherein the third to fifth insulating layers comprise either a boron phosphorous silicate glass, a spin-on glass or a photoresist.

8. A method of making a charge transfer device, in accordance with claim 1, wherein each of the semiconductor layer patterns has side surfaces extending perpendicularly to the surface of the first conductivity type semiconductor substrate.

9. A method of making a charge transfer device, in accordance with claim 1, wherein the conductive layer comprises either a metal, a transparent electrode material or a semiconductor material doped with an impurity.

10. A method of making a charge transfer device, in accordance with claim 9, wherein the metal is one of aluminum and tungsten.

11. A method of making a charge transfer device, in accordance with claim 9, wherein the transparent electrode material is an indium tin oxide.

12. A method of making a charge transfer device, in accordance with claim 9, wherein the semiconductor material is polycrystalline silicon.

13. A method of making a charge transfer device comprising the steps of:
   preparing a semiconductor substrate of a first conductivity type;
   forming an impurity layer of a second conductivity type, a first insulating layer and a semiconductor layer in this order, over the first conductivity type semiconductor substrate;
   patterning the semiconductor layer so as to form uniformly spaced semiconductor layer patterns;
   forming a second insulating layer over the resultant entire exposed surface after the formation of the semiconductor layer patterns and implanting impurity ions of the first conductivity type in the second conductivity type impurity layer so as to form uniformly spaced impurity layers of the first conductivity type;
   forming a third insulating layer for providing a surface smoothness over the resultant entire exposed surface after the formation of the first conductivity type impurity layers and etching back the third insulating layer to the upper surfaces of the semiconductor layer patterns;
   removing the semiconductor layer patterns and the remaining portions of the third insulating layer;
   forming a conductive layer and a fourth insulating layer for providing a surface smoothness in this order, over the entire surface of the remaining second insulating layer;
   etching back the fourth insulating layer until each upper portion of the conductive layer is partially exposed;
   removing partially each exposed upper portion of the conductive layer so as to form a plurality of separate conductive layer patterns;
   removing the remaining portions of the fourth insulating layer disposed over respective conductive layer patterns; and
   forming a fifth insulating layer over the resultant entire exposed surface after the removal of the fourth insulating layer.

14. A method of making a charge transfer device, in accordance with claim 13, wherein the step of forming the second conductivity type impurity layer comprises the steps /f:
   implanting impurity ions of the second conductivity type in the surface of the first conductivity type semiconductor substrate; and
   diffusing the second conductivity type impurity ions to a predetermined depth in the first conductivity type semiconductor substrate.

15. A method of making a charge transfer device, in accordance with claim 13, wherein the step of forming the second conductivity type impurity layer comprises the steps of forming another semiconductor layer over the first conductivity type semiconductor substrate; and
   implanting impurity ions of the second conductivity type in the surface of the another semiconductor layer, simultaneously with the formation of the another semiconductor layer.

16. A method of making a charge transfer device, in accordance with claim 13, wherein the semiconductor layer comprises polycrystalline silicon.

17. A method of making a charge transfer device, in accordance with claim 13, further comprising the step of dry etching the exposed portions of the first insulating layer using the semiconductor layer patterns as a mask prior to the formation of the second insulating layer, so as to remove the exposed portions of the first insulating layer.

18. A method of making a charge transfer device, in accordance with claim 13, wherein the formations of the first and second insulating layers are achieved by thermally oxidizing the first conductivity type semiconductor substrate and each semiconductor layer pattern, respectively.

19. A method of making a charge transfer device, in accordance with claim 13, wherein the third to fifth insulating layers comprise either a boron phosphorous silicate glass, a spin-on glass or a photoresist.

20. A method of making a charge transfer device, in accordance with claim 13, wherein each of the semiconductor layer patterns has side surfaces extending perpendicularly to the surface of the first conductivity type semiconductor substrate.

21. A method of making a charge transfer device, in accordance with claim 13, wherein the conductive layer comprises either a metal, a transparent electrode material or a semiconductor material doped with an impurity.

22. A method of making a charge transfer device, in accordance with claim 21, wherein the metal is one of aluminum and tungsten.

23. A method of making a charge transfer device, in accordance with claim 21, wherein the transparent electrode material is an indium tin oxide.

24. A method of making a charge transfer device, in accordance with claim 21, wherein the semiconductor material is polycrystalline silicon.

25. A method of making a charge transfer device, in accordance with claim 13, wherein the step of removing partially each exposed upper portion of the conductive layer is achieved by a wet etching method.

* * * * *

UNITED STATES PATENT AND TRADEMARK OFFICE
CERTIFICATE OF CORRECTION

PATENT NO. : 5,240,873
DATED : August 31, 1993
INVENTOR(S) : Uya Shinji

It is certified that error appears in the above-indentified patent and that said Letters Patent is hereby corrected as shown below:

On the title page, item:

[73]   Assignee:    GOLD STAR ELECTRON CO., LTD.
                    Republic of Korea Signed and Sealed this Twelfth Day of September, 1995

Attest:

BRUCE LEHMAN

Attesting Officer        Commissioner of Patents and Trademarks